United States Patent [19]
Leconte et al.

[11] Patent Number: 5,862,075
[45] Date of Patent: Jan. 19, 1999

[54] DEVICE FOR PROTECTION AFTER A PAGE-WRITE OPERATION IN AN ELECTRICALLY PROGRAMMABLE MEMORY

[75] Inventors: Bruno Leconte, Rousset, France; Alessandro Brigati, Castelsangiovanni, Italy; Jean Devin, Aix en Provence, France

[73] Assignee: SGS-Thomson Microelectronics S.A., Gentilly, France

[21] Appl. No.: 970,445

[22] Filed: Nov. 14, 1997

[30] Foreign Application Priority Data

Nov. 28, 1996 [FR] France .................................. 96 14776

[51] Int. Cl.⁶ .................................................. G11C 16/04
[52] U.S. Cl. ........................ 365/185.04; 365/185.12; 365/236; 365/238.5
[58] Field of Search ..................... 365/185.04, 185.12, 365/230.03, 230.08, 231, 233, 236, 238.5, 230.09

[56] References Cited

U.S. PATENT DOCUMENTS

| | | | |
|---|---|---|---|
| 5,097,445 | 3/1992 | Yamauchi | 365/185.04 |
| 5,363,330 | 11/1994 | Kobayashi et al. | 365/159.05 |
| 5,363,334 | 11/1994 | Alexander et al. | 365/185.04 |
| 5,570,315 | 10/1996 | Tanaka et al. | 365/185.12 |
| 5,621,692 | 4/1997 | Lin | 365/238.5 |
| 5,696,732 | 12/1997 | Zagar et al. | 365/238.5 |

FOREIGN PATENT DOCUMENTS 0 272 977   6/1988   European Pat. Off. .

OTHER PUBLICATIONS

Zitlaw, C., 8080 Wescon Conference Record, *"Recent Trends in Embedded Control Memory"*, (Nov. 1991), pp. 386–389.

*Primary Examiner*—Son T. Dinh
*Attorney, Agent, or Firm*—Allen, Dyer, Doppelt, Milbrath & Gilchrist, P.A.

[57] ABSTRACT

A FLASH memory is compatible with a standard EEPROM memory in terms of a write-by-page instruction with write protection. A circuit successively addresses one of the columns of a storage matrix in order to write a page previously stored in buffers, and the circuit addresses the writing of a protection bit after the writing of the page.

13 Claims, 1 Drawing Sheet

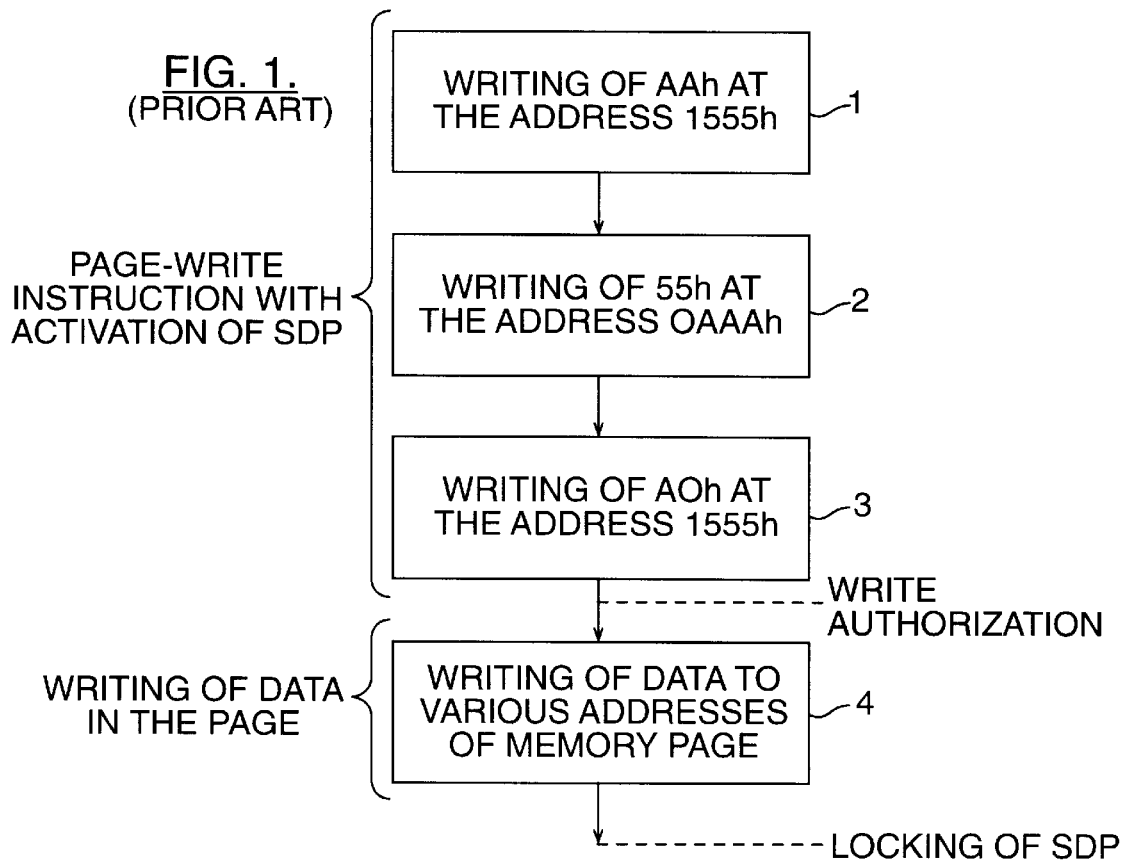
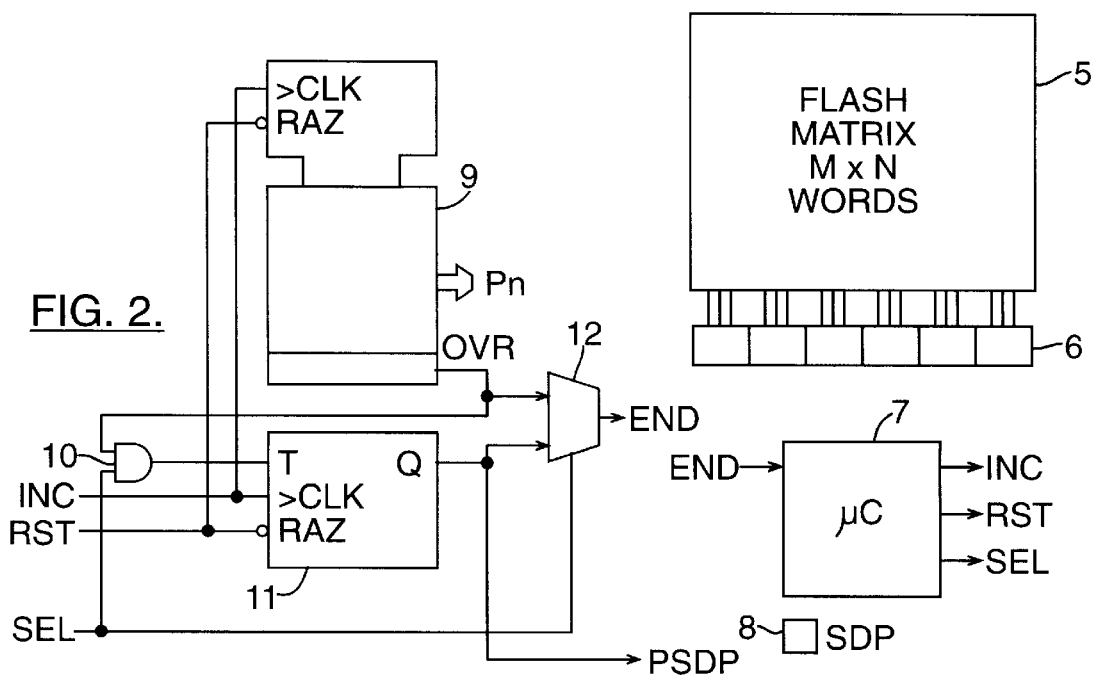

DEVICE FOR PROTECTION AFTER A PAGE-WRITE OPERATION IN AN ELECTRICALLY PROGRAMMABLE MEMORY

FIELD OF THE INVENTION

The invention relates to memories, and, more particularly, to a device for protection after a page-write operation in an electrically programmable memory. This device is used more particularly with FLASH type memories, i.e. memories using floating-gate transistors programmed by hot electrons.

BACKGROUND OF THE INVENTION

EEPROMs are memories that are electrically programmable and erasable by the tunnel effect (or Fowler Nordheim effect). These EEPROMs include memory cells comprising a floating-gate transistor and a selection transistor that is sometimes common to a group of cells forming a word. These are commonly used memories, and, accordingly, instruction protocols have been developed by manufacturers so that they can be mutually interchanged.

FLASH type memories are memories that are electrically programmable by hot electrons and electrically erasable by the tunnel effect. These memories are provided by storage cells comprising a single floating-gate transistor. The applications in which FLASH memories are used are often different from the applications in which EEPROMs are used. Moreover, FLASH memories are classically not compatible with EEPROM memories.

Since FLASH memories take up less space than EEPROM memories and can be programmed more speedily, the manufacturers of memories have conceived the idea of making a FLASH memory whose operation is compatible with that of a standard EEPROM. However, since the programming methods are different, adaptations are needed, causing certain problems to those skilled in the art.

The present invention pertains essentially to an instruction that is commonly used with EEPROM type memories. The instruction in question is a page-write operation followed by a write protection of the memory. According to the data books of the manufacturers of EEPROM type memories, the instruction is sent to the memory as follows: specific words are written at specific addresses, then the data elements of a given page are written, the page being defined as containing all the addresses of one and the same word line of the memory array. The writing of specific words at specific addresses defines the instruction.

By way of an example, FIG. 1 reproduces the standard sequence given by SGS-THOMSON MICROELECTRONICS for the memory marketed under the reference M28C64. This sequence is made for a memory with 13 address bits and 8 data bits. Since the addresses may vary according to the capacity of the memory, those skilled in the art can ascertain that the addresses always have the same form for the EEPROM type memories.

In an EEPROM memory, a microcontroller identifies the instruction sequence. Then the data elements to be written in the page are stored in buffer registers. When all the registers corresponding to a page have received a data element, the microcontroller starts a parallel write operation in all the cells of the word line and in a storage cell, conventionally called an SDP (for Software Data Protection) which indicates that the memory is protected and prohibits writing in the memory. The SDP cell is of same type as the memory cells providing the memory array, but is generally separate from the memory array. In EEPROM memories, a simple AND gate receiving the memory write command and a bit indicating the writing of the SDP are enough to carry out the programming of the SDP cell.

The transposition of this type of instruction to a FLASH type memory poses a problem to those skilled in the art. Indeed, programming by hot electrons requires greater energy than programming by the tunnel effect. Consequently, the parallel writing of all the data elements in the memory is unthinkable in a FLASH type memory. To write the data elements present in the various registers, a sequential write operation is used, programming the memory word by word. However, in this case it is no longer possible to manage the SDP cell in the same way as an EEPROM. An obvious approach may include using the microcontroller to program the SDP cell after having finished the writing of the page. Nevertheless, this approach is rather cumbersome and slows down the microcontroller.

It may be desirable to have a device for the writing of the SDP cell that enables the automatic writing of this SDP cell without the intervention of the microcontroller. It may also be desirable to use a microcontroller not very different from that used for an EEPROM, thus reducing the time needed to devise and finalize the microcontroller and its program.

SUMMARY OF THE INVENTION

An object of the invention is a circuit for the sequencing of write operations in a floating-gate type memory programmable by hot electrons and having a write-by-page instruction with write protection. The data elements of the page are stored temporarily in buffers. The circuit preferably comprising first means to successively address one of the columns of a storage matrix to write the contents of each of the buffers in a page of the memory and report the end of the writing in the page. The circuit preferably also includes second means to address the writing of a protection bit only if the first means reports the end of the writing in the pages and if an indicator bit indicates that the protection bit has to be activated.

BRIEF DESCRIPTIONS OF THE DRAWINGS

The invention will be understood more clearly and other advantages shall appear from the following description made with reference to the appended drawings of which:

FIG. 1 represents the control sequence as in the prior art to be sent to an EEPROM type memory that initiates the writing of a page followed by a protection in write mode, and FIG. 2 shows a preferred embodiment of the invention.

MORE DETAILED DESCRIPTION

FIG. 1, as stated above, represents the page-write instruction and protection control sequence for an EEPROM memory referred M28C64 by SGS-THOMSON MICROELECTRONICS. The first three steps 1 to 3 correspond to an instruction. Alternatives exist as a function of the capacity of the memory.

The first step 1 includes writing the hexadecimal data element AA at the hexadecimal address 1555 for the memory referred to above, this memory having 13 address bits. For a memory having a different number of address bits, the address is different but corresponds to the same alternation of "0" and "1" on a different number of bits. The second step 2 includes writing the hexadecimal data element 55 at the hexadecimal address OAAA. The third step 3 includes writing the hexadecimal data element AO at the hexadecimal address 1555. For the second and third steps 2 and 3, the same address modifications can be made as in the case of the first step 1.

After reception of these three steps 1 to 3 of fictitious writing, a microcontroller in charge of managing the memory knows that these steps relate to a page-write instruction followed by a protection of the memory in the write mode. The fourth step 4 includes sending a series of data elements to various addresses of a page of the memory. The page designation corresponds conventionally to all the storage cells of a storage matrix located on one and the same line. The microcontroller will load the various data elements into storage buffers (which are generally volatile registers), each buffer corresponding to a column of the storage matrix. When all the buffers have received a data element, the writing will be carried out in the matrix at the designated page, and a protection bit is written simultaneously to indicate that the memory is no longer accessible in the write mode.

This already known principle of decoding instructions in an EEPROM is fully included within the framework of an EEPROM using a FLASH memory matrix. Since the invention does not pertain to the principle of the decoding of the instruction, this decoding of the instruction and the writing in the buffers shall not be described in greater detail.

FIG. 2 shows the elements needed for a clearer understanding of the invention. A storage matrix 5 of the FLASH type, i.e. having one and only one floating-gate transistor in each storage cell, organized in M rows of N words, comprises the storage array of the memory. For example, for a memory with a capacity of 64 kilobits, it is possible to use eight-bit words and have M=128, N=64. Each row is connected to a row decoder (not shown) and each column is connected, firstly, to a reading device (not shown) and, secondly, to volatile buffers 6. The volatile buffers 6 are, conventionally, registers used to store the data to be written in the memory to reduce the write access time. The volatile buffers 6 have a storage capacity equal to the storage capacity of a full row of the storage matrix 5, thus making it possible to memorize a complete page.

A microcontroller 7 is entrusted with supervising the memory. The task of this microcontroller 7 is to send and receive various control and operation signals to the various units of the memory to ensure the operation of the memory. The microcontroller 7 includes the known means that EEPROMs have to carry out instruction decoding and write operations in the volatile buffers 6. Only the signals needed for a clearer understanding of the invention have been shown. The microcontroller 7 has an input receiving an end-of-writing signal END, a first output giving a signal SEL that indicates the protection to be provided at the conclusion of the writing of a page in the memory, a second output giving a signal RST for the start of a page-write sequence, and a third output giving a memory write sequencing signal INC. The signals of the input and the first and second outputs are identical to the signals of a conventional EEPROM type memory.

The write sequencing signal is specific to the write signals used in a conventional FLASH memory. For example, when it is at "1", the signal INC validates a writing of a word in the memory, and when it is at "0", the signal INC indicates the end of a writing stage. This write signal will actually control various units needed for the programming that are used to generate and convey the various voltages needed for the programming, well known those skilled in the art who use FLASH type memories.

A protection cell 8 contains the SDP write protection bit. This cell is identical to a storage cell of the matrix 5 but can be located anywhere in the memory. The connections of this cell used to program it or read it have not been shown but are identical to the means necessary to read and write in a FLASH type memory cell and can be common to other memory cells containing other indicators.

A counter 9 has a clock input, a reset input, an output bus and a carry output. In the case of a page-write operation, this counter 9 is reset by the signal RST and is then incremented after each memory-write operation, the signal INC being received at the clock input, and the output bus Pn informs a column decoder on which word column is to be written. When the counter has carried out one counter turn, it activates a signal OVR on the carry output.

An AND gate 10, with two inputs and one output, receives the signal OVR at one of its inputs and the signal SEL at the other of its inputs. The output of the AND gate is active when the signal OVR and the signal SEL are active simultaneously. A T type flip-flop circuit 11 has a signal input, a clock input, a reset input, and an output. The signal input is connected to the output of the AND gate 10. The clock input receives the signal INC. The reset input receives the signal RST. The output provides a signal PSDP to program the SDP bit which initiates the writing of the protection cell 8 when said signal PSDP is active. The flip-flop circuit 11 is set at zero when a page-write sequence is begun and switches over to an active state only after the writing of the last word of a page when the signal SEL is active.

A multiplexer 12 has two signal inputs, one selection input and one output. One of the signal inputs receives the signal OVR and the other signal input receives the signal PSDP. The output provides the signal END. The selection input receives the signal SEL so that when a page-write operation is performed without protection, the signal END corresponds to the signal OVR and when a page-write operation is performed with protection, the signal END corresponds to the signal PSDP.

Thus, when the microcontroller carries out a page-write operation without protection, it provides an active signal RST at the beginning of the write sequence and provides an inactive signal SEL. The counter 9 will count all the addresses of a page, the pace of the counter 9 being set by the write signal INC. Then, at the conclusion of the counting operation, the signal END will become active, informing the microcontroller 7 of the end of the page-write operation.

On the other hand, when the microcontroller carries out a page-write operation with protection, it provides a signal RST that is active at the beginning of the write sequence and provides an active signal SEL. The counter 9 will count all the addresses of a page, the rate of the counter being set by the write signal INC. Then, at the end of the counting, the flip-flop circuit 11 will activate the signal PSDP controlling the writing of the protection bit SDP. The signal END becomes active at the time of the writing of the protection bit SDP, informing the microcontroller 7 of the end of the writing of the page after the writing of the protection bit. A device of this kind makes it possible to use a microcontroller 7 that is programmed independently of the number of columns of the matrix 5. Nevertheless, the counter 9 must take account of the number of columns.

Many alternatives are possible. In the preferred exemplary embodiment, a counter and a T type flip-flop circuit have been used. In fact, the counter 9 can be replaced by any type of means enabling the successive addressing of one of the columns of a storage matrix to write the contents of each of the volatile buffers 6 in a page of the memory and indicate the end of the page-write operation. It is possible, for example, to use a shift register, but the surface area taken up by a shift register would then be much greater.

The T type flip-flop circuit 11 and the AND gate 10 can be replaced by means enabling the addressing of the writing of the cell 8 that contains the protection bit SDP when the counter 9 (or the equivalent means) indicates the end of the page-write operation and indicating, if the bit SEL is active, that the bit SDP must be activated. Any type of flip-flop circuit can be used. An RS type flip-flop circuit is quite appropriate, provided that it can give a signal to program the protection bit SDP at an output. However, depending on the type of flip-flop circuit used and the active state of the signals, the AND gate 10 must be replaced by an equivalent gate.

The multiplexer 12 is a multiplexer in the broad sense of the term. In other words, it is an information routing device that functions like a multiplexer. Three-state type outputs have an equivalent function and make it possible to do without this multiplexer 12.

That which is claimed is:

1. A circuit for the sequencing of write operations in a floating-gate type memory, comprising a storage matrix being programmable by hot electrons and buffers for temporarily storing data elements of a page, the floating-gate type memory having a write-by-page instruction with write protection, the circuit comprising:

first means for successively addressing one of the columns of the storage matrix to write contents of each of the buffers into a page of the memory and for reporting an end of the writing into the page; and second means for addressing the writing of a protection bit only if the first means reports the end of the writing into the page and if an indicator bit indicates that the protection bit has to be activated.

2. A circuit according to claim 1, further comprising a microcontroller and a multiplexer connected thereto for providing the microcontroller with an end-of-programming signal from either the first means or the second means depending on a state of the indicator bit.

3. A circuit according to claim 1, wherein said first means includes a counter having a first input to receive a clock signal corresponding to a write signal, a second input to receive a reset signal, a parallel output to provide a number corresponding to an address of the one of the columns of the storage matrix, and an end-of-counting output to report that counting is finished and that the programming of the page is finished.

4. A circuit according to claim 1, wherein said second means comprises a storage flip-flop circuit for providing, at an output, a signal to program the protection bit.

5. A floating-gate type memory circuit having a write-by-page instruction with write protection, said memory circuit comprising:

a storage matrix of floating-gate type cells being programmable by hot electrons;

a plurality of buffers for temporarily storing data elements of a page; and sequencing means for sequencing write operations, said sequencing means comprising:

first means for successively addressing one of the columns of the storage matrix to write contents of each of the buffers into a page of the memory and for reporting an end of the writing into the page; and second means for addressing the writing of a protection bit only if the first means reports the end of the writing into the page and if an indicator bit indicates that the protection bit has to be activated.

6. A memory circuit according to claim 5, further comprising a microcontroller and a multiplexer connected thereto for providing the microcontroller with an end-of-programming signal from either the first means or the second means depending on a state of the indicator bit.

7. A memory circuit according to claim 5, wherein said first means includes a counter having a first input to receive a clock signal corresponding to a write signal, a second input to receive a reset signal, a parallel output to provide a number corresponding to an address of the one of the columns of the storage matrix, and an end-of-counting output to report that counting is finished and that the programming of the page is finished.

8. A memory circuit according to claim 5, wherein said second means comprises a storage flip-flop circuit for providing, at an output, a signal to program the protection bit.

9. A circuit for the sequencing of write operations in a floating-gate type memory comprising a storage matrix being programmable by hot electrons and buffers for temporarily storing data elements of a page, the floating-gate type memory having a write-by-page instruction with write protection, the circuit comprising:

a counter having a first input to receive a clock signal corresponding to a write signal, a second input to receive a reset signal, a parallel output to provide a number corresponding to an address of the one of the columns of the storage matrix, and an end-of-counting output to report that counting is finished and that the programming of the page is finished; and second means for addressing the writing of a protection bit only if the first means reports the end of the writing into the page and if an indicator bit indicates that the protection bit has to be activated.

10. A circuit according to claim 9, further comprising a microcontroller and a multiplexer connected thereto for providing the microcontroller with an end-of-programming signal from either the first means or the second means depending on a state of the indicator bit.

11. A circuit according to claim 9, wherein said second means comprises a storage flip-flop circuit for providing, at an output, a signal to program the protection bit.

12. A method for the sequencing of write operations in a floating-gate type memory comprising a storage matrix being programmable by hot electrons and buffers for temporarily storing data elements of a page, the floating-gate type memory having a write-by-page instruction with write protection, the method comprising the steps of:

successively addressing one of the columns of the storage matrix to write contents of each of the buffers into a page of the memory and reporting an end of the writing into the page; and addressing the writing of a protection bit only if the first means reports the end of the writing into the page and if an indicator bit indicates that the protection bit has to be activated.

13. A method according to claim 12, wherein the memory further comprises a microcontroller and a multiplexer connected thereto; and further comprising the step of using the multiplexer for providing the microcontroller with an end-of-programming information element.

* * * * *